United States Patent
Liu et al.

(10) Patent No.: US 9,024,286 B2
(45) Date of Patent: May 5, 2015

(54) RRAM CELL WITH BOTTOM ELECTRODE(S) POSITIONED IN A SEMICONDUCTOR SUBSTRATE

(71) Applicants: GLOBALFOUNDRIES Singapore PTE Ltd, Singapore (SG); Nanyang Technological University, Singapore (SG)

(72) Inventors: Wenhu Liu, Singapore (SG); Kin-Leong Pey, Singapore (SG); Nagarajan Raghavan, Singapore (SG); Chee Mang Ng, Singapore (SG)

(73) Assignees: GLOBALFOUNDRIES Singapore PTE Ltd, Singapore (SG); Nanyang Technological University, Singapore (SG)

(*) Notice: Subject to any disclaimer, the term of this patent is extended or adjusted under 35 U.S.C. 154(b) by 0 days.

(21) Appl. No.: 14/087,183

(22) Filed: Nov. 22, 2013

(65) Prior Publication Data
US 2014/0077148 A1   Mar. 20, 2014

Related U.S. Application Data

(63) Continuation of application No. 13/052,864, filed on Mar. 21, 2011, now abandoned.

(51) Int. Cl.
H01L 47/00 (2006.01)
H01L 45/00 (2006.01)
H01L 27/24 (2006.01)

(52) U.S. Cl.
CPC ........ *H01L 45/1253* (2013.01); *H01L 27/2472* (2013.01); *H01L 45/08* (2013.01); *H01L 45/1233* (2013.01); *H01L 45/145* (2013.01); *H01L 45/16* (2013.01)

(58) Field of Classification Search
CPC ............ H01L 45/1253; H01L 45/1233; H01L 27/2472; H01L 45/08; H01L 45/16; H01L 45/145
USPC .......................................................... 257/4
See application file for complete search history.

(56) References Cited

U.S. PATENT DOCUMENTS

| | | | |
|---|---|---|---|
| 4,507,159 A | 3/1985 | Erb | 438/395 |
| 4,676,866 A * | 6/1987 | Tang et al. | 438/643 |

(Continued)

OTHER PUBLICATIONS

Deng et al., "Salicidation process using NiSi and its device application," *J Appl. Phys.*, 81:804-751, 1997.

(Continued)

*Primary Examiner* — Jarrett Stark
(74) *Attorney, Agent, or Firm* — Amerson Law Firm, PLLC

(57) ABSTRACT

Generally, the subject matter disclosed herein relates to the fabrication of an RRAM cell using CMOS compatible processes. A resistance random access memory device is disclosed which includes a semiconducting substrate, a top electrode, at least one metal silicide bottom electrode formed at least partially in the substrate, wherein at least a portion of the at least one bottom electrode is positioned below the top electrode, and at least one insulating layer positioned between the top electrode and at least a portion of the at least one bottom electrode. A method of making a resistance random access memory device is disclosed that includes forming an isolation structure in a semiconducting substrate to thereby define an enclosed area, performing at least one ion implantation process to implant dopant atoms into the substrate within the enclosed area, after performing the at least one ion implantation process, forming a layer of refractory metal above at least portions of the substrate, and performing at least one heat treatment process to form at least one metal silicide bottom electrode at least partially in the substrate, wherein at least a portion of the at least one bottom electrode is positioned below at least a portion of a top electrode of the device.

20 Claims, 7 Drawing Sheets

(56) References Cited

U.S. PATENT DOCUMENTS

| | | | | |
|---|---|---|---|---|
| 5,099,305 | A | * | 3/1992 | Takenaka ............... 257/295 |
| 5,173,760 | A | | 12/1992 | Min et al. ............... 257/378 |
| 5,332,682 | A | | 7/1994 | Lowrey ............... 438/252 |
| 5,973,381 | A | | 10/1999 | Kudo et al. ............... 257/532 |
| 6,403,482 | B1 | | 6/2002 | Rovedo et al. ............... 438/689 |
| 6,531,371 | B2 | | 3/2003 | Hsu et al. ............... 438/385 |
| 6,642,607 | B2 | | 11/2003 | Ohnishi et al. ............... 257/595 |
| 6,867,996 | B2 | | 3/2005 | Campbell et al. ............... 365/100 |
| 6,870,755 | B2 | | 3/2005 | Rinerson et al. ............... 365/148 |
| 6,946,702 | B2 | | 9/2005 | Jang ............... 257/306 |
| 6,960,500 | B2 | * | 11/2005 | Shin et al. ............... 438/201 |
| 7,067,865 | B2 | | 6/2006 | Lung ............... 257/296 |
| 7,149,108 | B2 | | 12/2006 | Rinerson et al. ............... 365/163 |
| 7,157,750 | B2 | | 1/2007 | Bulovic et al. ............... 257/200 |
| 7,238,984 | B2 | | 7/2007 | Shibata et al. ............... 257/324 |
| 7,292,469 | B2 | | 11/2007 | Lee et al. ............... 365/163 |
| 7,426,128 | B2 | * | 9/2008 | Scheuerlein ............... 365/63 |
| 7,569,844 | B2 | | 8/2009 | Lung ............... 257/2 |
| 7,606,055 | B2 | | 10/2009 | Liu ............... 365/51 |
| 7,786,461 | B2 | | 8/2010 | Lung ............... 257/2 |
| 7,875,493 | B2 | | 1/2011 | Lung ............... 438/95 |
| 7,956,344 | B2 | | 6/2011 | Lung ............... 257/2 |
| 8,115,586 | B2 | | 2/2012 | Hosoi et al. ............... 338/20 |
| 8,174,865 | B2 | | 5/2012 | Rhie et al. ............... 365/148 |
| 8,183,126 | B2 | | 5/2012 | Lee et al. ............... 438/455 |
| 8,304,841 | B2 | | 11/2012 | Xu et al. ............... 257/384 |
| 8,609,460 | B2 | * | 12/2013 | Liu et al. ............... 438/104 |
| 8,673,692 | B2 | * | 3/2014 | Tan et al. ............... 438/128 |
| 8,697,533 | B2 | * | 4/2014 | Herner ............... 438/385 |
| 8,835,896 | B2 | * | 9/2014 | Miyagawa et al. ............... 257/4 |
| 2002/0017657 | A1 | | 2/2002 | Coffa et al. ............... 257/200 |
| 2002/0047163 | A1 | * | 4/2002 | Sayama et al. ............... 257/368 |
| 2002/0192881 | A1 | | 12/2002 | Ballantine et al. ............... 438/147 |
| 2003/0017639 | A1 | | 1/2003 | Ballantine et al. ............... 438/48 |
| 2005/0073678 | A1 | * | 4/2005 | Tahir-Kheli et al. ............... 356/300 |
| 2006/0035430 | A1 | * | 2/2006 | Gutsche et al. ............... 438/243 |
| 2007/0008865 | A1 | * | 1/2007 | Adams et al. ............... 369/126 |
| 2007/0066014 | A1 | | 3/2007 | Park et al. ............... 438/257 |
| 2008/0001172 | A1 | * | 1/2008 | Karg et al. ............... 257/194 |
| 2008/0078985 | A1 | * | 4/2008 | Meyer et al. ............... 257/6 |
| 2009/0103355 | A1 | | 4/2009 | Saitou ............... 365/184 |
| 2009/0147558 | A1 | * | 6/2009 | Tamai et al. ............... 365/148 |
| 2010/0006813 | A1 | * | 1/2010 | Xi et al. ............... 257/4 |
| 2010/0237404 | A1 | | 9/2010 | Toba et al. ............... 257/326 |
| 2010/0258779 | A1 | | 10/2010 | Mikawa et al. | |
| 2011/0108829 | A1 | * | 5/2011 | Banno ............... 257/43 |
| 2012/0061639 | A1 | | 3/2012 | Yasuda | |
| 2012/0074374 | A1 | * | 3/2012 | Jo ............... 257/4 |
| 2012/0106232 | A1 | * | 5/2012 | Meade et al. ............... 365/129 |
| 2012/0241709 | A1 | * | 9/2012 | Tsuji ............... 257/2 |
| 2013/0062588 | A1 | * | 3/2013 | Sakotsubo ............... 257/4 |

OTHER PUBLICATIONS

Gambino and Colgan, "Silicides and ohmic contacts," *Materials Chemistry and Physics*, 52:99-146, 1998.

Koshida et al., "Field-induced functions of porous Si as a confined system," *J. of Luminescence*, 80:37-42, 1999.

Liu et al., "Observation of Switching Behaviors in Post-Breakdown Conductions in NiSi-gated Stacks," IEDM09:135-138, 2009.

Ma et al., "Nonvolatile electrical bistability of organic/metal-nanocluster/organic system," *Applied Physics Letters*, 82:1419-21, 2003.

Raghavan et al., "Unipolar recovery of dielectric breakdown in fully silicided high-k gate stack devices and its reliability implications," *Applied Physics Letters*, 96:142901, 2010.

Rozenberg et al., "Nonvolatile Memory with Multilevel Switching: A Basic Model," *Physical Review Letters*, 92:178302, 2004.

Sakamoto et al., "Nanometer-scale switches using copper sulfide," *Applied Physics Letters*, 82:3032-34, 2003.

Terabe et al., "Ionic/electronic mixed conductor tip of a scanning tunneling microscope as a metal atom source for nanostructuring," *Applied Physics Letters*, 80:4009-11, 2002.

Chindalore et al., "Embedded Split-Gate Flash Memory with Silicon Nanocrystals for 90nm and Beyond," *2008 Symposium on VLSI Technology Digest of Technical Papers*, pp. 136-137, 2008.

Chiu et al., "A Low Store Energy, Low VDDmin, Nonvolatile 8T2R SRAM with 3D Stacked RRAM Devices for Low Power Mobile Applications," *2010 Symposium on VLSI Circuits/Technical Digest of Technical Papers*, pp. 229-230, 2010.

Kuegeler et al., "Materials, technologies, and circuit concepts for nanocrossbar-based bipolar RRAM," *Appl. Phys. A*, 102:791-809, 2011.

Lee et al., "2-stack 1D-1R Cross-point Structure with Oxide Diodes as Switch Elements for High Density Resistance RAM Applications," *2007 IEEE*, pp. 771-774, 2007.

Russo et al., "Filament Conduction and Reset Mechanism in NiO-Based Resistive-Switching Memory (RRAM) Devices," *IEEE Transactions on Electron Devices*, 56:186-192, 2009.

Sekar, "IEEE SCV EDS Technical Events, Nov. 16, 2010, Resistive RAM: Technology and Market Opportunities" Presentation, 2010.

Shimizu et al., "A Novel High-Density $5F^2$ NAND STI Cell Technology Suitable for 256Mbt and 1Gbit Flash Memories," *1997 IEEE*, pp. 97-271-97-274, 1997.

Tseng et al., "High Density and Ultra Small Cell Size of Conctact ReRAM (CR-RAM) in 90nm CMOS Logic Technology and Circuits," *2009 IEEE*, pp. 09-109-09-112, 2009.

Tsunoda et al., "Low Power and High Speed Switching of Ti-doped NiO ReRAM under the Unipolar Voltage Source of less than 3 V," *2007 IEEE*, pp. 767-770, 2007.

Wei et al., "Highly Reliable $TaO_x$ ReRAM and Direct Evidence of Redox Reaction Mechanism," *2008 IEEE*, pp. 293-296, 2008.

Whang et al., "Novel 3-Dimensional Dual Control-Gate with Surrounding Floating-Gate (DC-SF) NAND Flash Cell for 1Tb File Storage Application," *2010 IEEE*, pp. 10-668-10-671, 2010.

* cited by examiner

RRAM CELL WITH BOTTOM ELECTRODE(S) POSITIONED IN A SEMICONDUCTOR SUBSTRATE

CROSS-REFERENCE TO RELATED APPLICATIONS

This is a continuation of co-pending application Ser. No. 13/052,864, filed Mar. 21, 2011.

BACKGROUND

1. Field of the Disclosure

Generally, the present disclosure relates to sophisticated integrated circuits, and, more particularly, to the fabrication of an RRAM cell with, in one embodiment, one or more bottom electrodes formed by silicidation using CMOS compatible processes.

2. Description of the Related Art

Memory circuits and devices are widely used in the electronics industry. In general, memory devices permit the storage of a "bit" of information, i.e., a "1" (logically high) or a "0" (logically low) signal. Vast numbers of these memory devices are formed on a single chip so as to permit the storage of a vast quantity of digital information. Various forms of such devices, and read/write circuitry employed with such devices, have been used in the industry for years, e.g., RAM (Random Access Memory) devices, ROM (Read Only Memory) devices, EEPROM (Electrically Erasable Read Only Memory) devices, etc.

Nonvolatile memory is a type of memory that retains stored data when power is removed from the memory device. Such nonvolatile memory devices are widely employed in mobile communication devices, computers, memory cards, etc. Flash memory is an example of one type of nonvolatile memory that is greatly used in such modern electronic devices.

More recently, another form of memory, RRAM (Resistance Random Access Memory) has been introduced to the industry. FIGS. 1A-1B schematically depict an illustrative prior art RRAM device 100. Basically, such a prior art RRAM device 100 is comprised of a multilayered stack of materials, and it is fabricated using a layer-by-layer technique. As shown in FIG. 1A, in one embodiment, the prior art RRAM device 100 comprises a top electrode 102, a tunnel oxide 104, a layer of conductive metal oxide 106, and a bottom electrode 108. The top electrode 102 and the bottom electrode 108 may be comprised of, for example, platinum. The tunnel oxide layer 104 may be comprised of silicon dioxide and it may have an illustrative thickness of 20-50 Å. The conductive metal oxide layer 106 may be comprised of $TiO_2$ or Cr-doped $SrTiO_3$.

FIG. 1B schematically depicts how the RRAM device 100 works. In the depicted example, a positive voltage $V^+$ is applied to the top electrode 102, while the bottom electrode 108 is coupled to ground ("GRND"). Application of the positive voltage $V^+$ attracts negatively charged ions 110 from the conductive metal oxide layer 106 which thereby causes breakdown of the tunnel oxide 104. This breakdown results in the establishment of an electrical current path between the top electrode 102 and the bottom electrode 108, and the resulting electrical current can be measured. Application of a negative voltage ($V^-$) to the top electrode 102 forces or repels the negatively charged ions 110 back toward the conductive metal oxide layer 106. This action "turns off" the conductive current path that was previously established, and cuts off the previously established current flow.

Importantly, as noted above, the prior art RRAM device 100 is made using a traditional layer-by-layer approach that involves many discrete deposition, lithography and etching steps, perhaps for each layer of the device. Such a layered construction of the prior art RRAM device 100 makes it more difficult to incorporate it into integrated circuit devices that are manufactured using modern CMOS processing technology and methods. For example, fabrication of an RRAM device using the layer-by-layer approach may result in the overall height of the RRAM device 100 being greater than the height of other structures that are formed in traditional CMOS-type devices, such as PMOS and NMOS transistors. Such height differences can lead to patterning errors in photolithography operations and/or mandate additional processing steps be taken to avoid or reduce the adverse effects of such height differences, e.g., the performance of one or more additional deposition and planarization processes.

The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to the fabrication of an RRAM cell using CMOS compatible processes. In the disclosed examples, the RRAM devices disclosed herein may be of a single bit or a dual bit configuration. In one illustrative embodiment, a resistance random access memory device is disclosed which includes a semiconducting substrate, a metal silicide top electrode positioned above the substrate, a single metal silicide bottom electrode formed at least partially in said substrate, wherein at least a portion of the single bottom electrode is positioned below an entire width of the top electrode and at least one insulating layer positioned between the top electrode and single bottom electrode. In another illustrative example, a resistance random access memory device includes a semiconducting substrate, and a metal silicide top electrode positioned above the substrate. The illustrative device further includes two separated metal silicide bottom electrodes formed at least partially in the substrate, wherein at least a portion of each of the two bottom electrodes is positioned below separate portions of the top electrode, and at least one insulating layer positioned between the portions of the top electrode and the portions of each of the two bottom electrodes that are positioned below the top electrode.

A method of making a resistance random access memory device including a top electrode is also disclosed which includes forming an isolation structure in a semiconducting substrate to thereby define an enclosed area, performing at least one ion implantation process to implant dopant atoms into the substrate within the enclosed area, after performing the at least one ion implantation process, forming a layer of refractory metal above at least portions of the substrate, and performing at least one heat treatment process to form at least one metal silicide bottom electrode at least partially in the substrate, wherein at least a portion of the at least one bottom electrode is positioned below at least a portion of a top electrode of the device.

BRIEF DESCRIPTION OF THE DRAWINGS

The disclosure may be understood by reference to the following description taken in conjunction with the accompanying drawings, in which like reference numerals identify like elements, and in which.

Figure 1A:
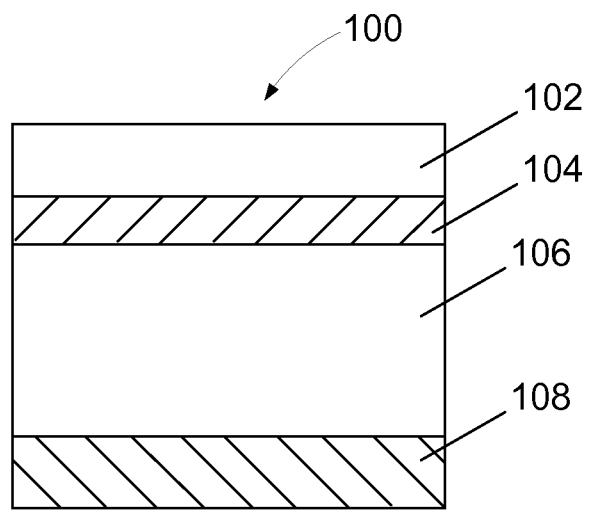
FIGS. 1A-1B schematically depict an illustrative prior art RRAM device.
Figure 1B:
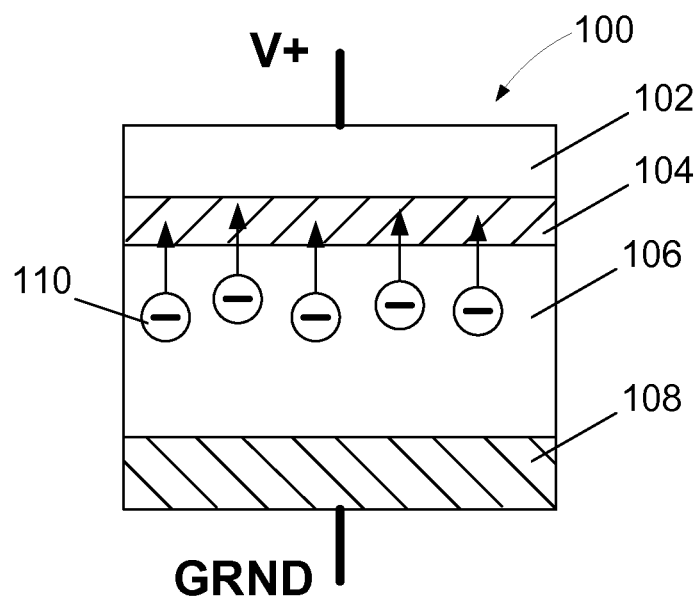

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
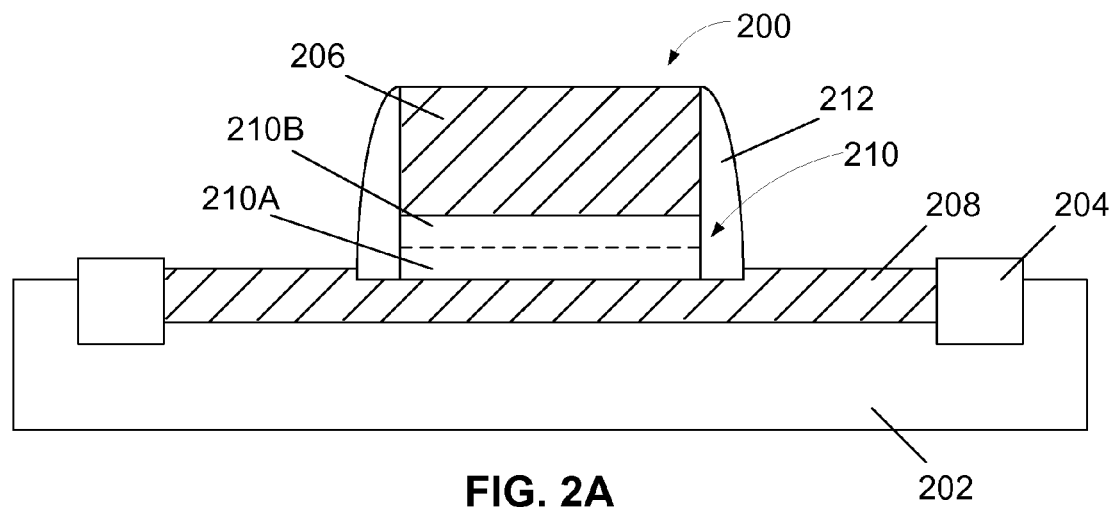
FIGS. 2A-2C schematically depict illustrative embodiments of a novel RRAM device disclosed herein.
Figure 2B:
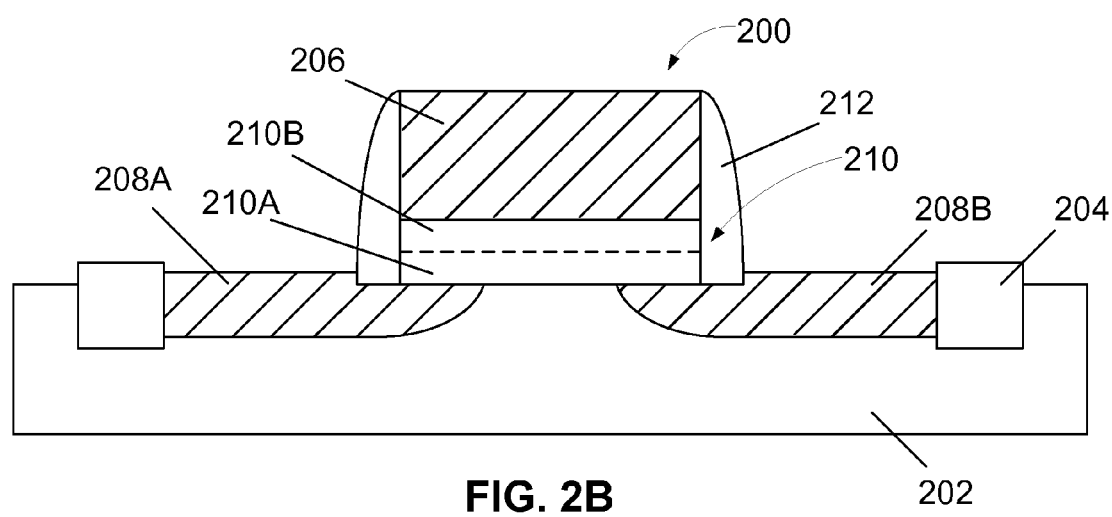
Figure 2C:
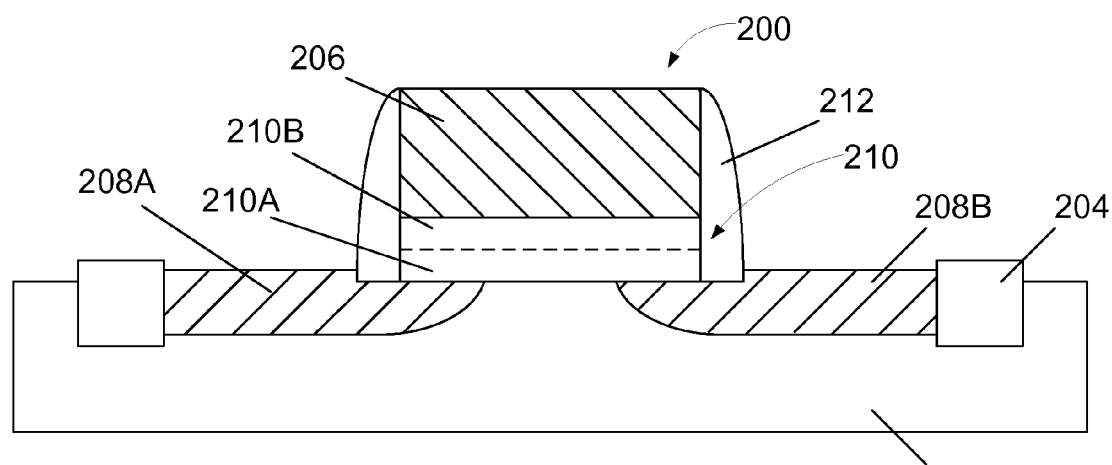

FIGS. 2A-2C depict various illustrative embodiments of the novel RRAM device 200 disclosed herein. FIG. 2A is a depiction of a single-bit embodiment of the present disclosure, while FIG. 2B depicts an illustrative example of a dual-bit configuration of the RRAM device 200 disclosed herein.

As shown in FIG. 2A, the RRAM device 200 is formed in and above a semiconducting substrate 202. An isolation structure 204, e.g., a shallow trench isolation structure, is provided to electrically isolate the RRAM device 200 from other devices. The RRAM device 200 comprises a top electrode 206 and a bottom electrode 208 that are separated by one or more insulation layers 210. The RRAM device 200 further includes one or more schematically depicted sidewall spacers 212. As depicted in FIG. 2A, the bottom electrode 208 is a unitary structure that extends across what would be the channel region of a similarly shaped CMOS transistor. The insulation layer 210 may be comprised of one or more layers of material. In one example, an interfacial layer 210A (indicated by the dashed line in the figures) may be formed on the substrate 202. The materials of construction of the interfacial layer 210A may vary depending upon the application. In one example, the interfacial layer 210A may be comprised of a silicon-rich $SiO_x$ material, where x<2, e.g., silicon suboxide, and it may have a thickness of approximately 1.2 nm. The interfacial layer 210A may be formed using a variety of techniques, e.g., CVD (chemical vapor deposition), ALD (atomic layer deposition), a thermal growth process, etc. The interfacial layer 210A may not be required in all applications.

The insulation layer 210B depicted in FIG. 2A may be employed in conjunction with, or in the absence of, the interfacial layer 210A. The insulation layer 210B may be a high-k material (a material having a dielectric constant greater than 3.9 which is the dielectric constant of $SiO_2$). In one illustrative example, the insulation layer 210B may be made of hafnium-silicon-oxynitride (HfSiON), and it may have a thickness of, for example, approximately 2.5 nm. The insulation layer 210B may be made of other materials, such as silicon oxynitride. The insulation layer 210B may be manufactured using a variety of known processes, e.g., CVD, ALD, etc.

In the illustrative embodiment depicted in FIG. 2A, the top electrode 206 and the bottom electrode 208 are both made of metal silicide materials, such as nickel silicide, although other metal silicides may be employed. Moreover, the metal silicide materials used for the top electrode 206 and the bottom electrode 208 may not be of the same metal silicide in all applications. In one illustrative example, the top electrode 206 may have a thickness of approximately 2-5 nm, while the bottom electrode 208 may have a maximum thickness of approximately 50 nm. One manner in which the top electrode 206 and the bottom electrode 208 may be formed is discussed more fully below. The spacers 212 may be of traditional construction and materials, and they may be formed by traditional techniques, i.e., deposition of a layer of spacer material followed by the performance of an anisotropic etching process.

As noted previously, the embodiment depicted in FIG. 2B is a "dual-bit" embodiment of the RRAM device 200 that is the subject of the present disclosure. More specifically, whereas the illustrative embodiment depicted in FIG. 2A includes a single, unitary bottom electrode 208, the dual-bit embodiment depicted in FIG. 2B has two separate bottom electrodes 208A, 208B. One technique for forming the RRAM device 200 in this dual-bit configuration will be discussed more fully below.

FIG. 2C depicts yet another illustrative embodiment of the RRAM device 200 wherein the top electrode 206 is made from a metal-containing and highly conductive material that is oxygen soluble, such as titanium nitride or nickel silicide, having an oxygen solubility of 33 and 0.05 (atom %), respectively. Thus, in one illustrative example, the top electrode 206 may be made from a conductive material having an oxygen solubility of at least 0.05 (atom %). As will be recognized by those skilled in the art after a complete reading of the present application, the top electrode 206 for the RRAM device 200 may be manufactured using a "gate-first" or a "gate-last" technique, both of which are well known to those skilled in the art. For example, with respect to the illustrative embodiment depicted in FIG. 2C, the bottom electrodes 208A and 208B may be formed while a sacrificial material, e.g., polysilicon, acts as a placeholder material during the fabrication of the two bottom electrodes 208A, 208B. Thereafter, using typical "gate-last" techniques, the sacrificial material may be removed and the final material, e.g., titanium nitride, for the top electrode 206 may be formed. Of course, as will be appreciated by those skilled in the art after reading the present application, the RRAM device 200 depicted in FIG. 2C could also be employed with a single bottom electrode 208, like that depicted in FIG. 2A. Additionally, the substrate 202 depicted in FIGS. 2A-2C is illustrative in nature, as the RRAM devices 200 disclosed herein can be formed with other substrate configurations, e.g., an SOI (silicon-on-insulator) substrate.

Figure 3A:
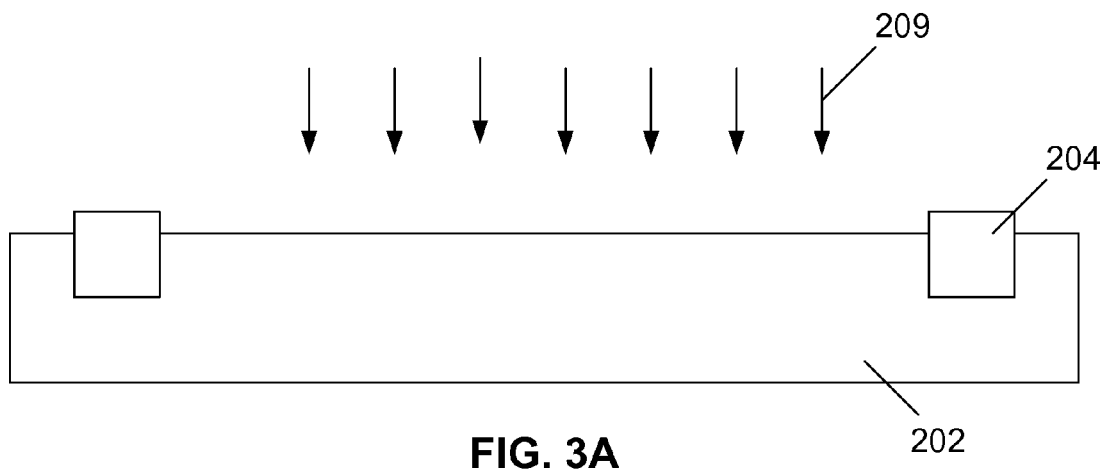
FIGS. 3A-3C depict one illustrative process flow for forming an illustrative RRAM device disclosure herein.

One illustrative method of forming the RRAM devices disclosed herein will now be discussed with reference to FIGS. 3A-3C. FIG. 3A depicts a point of fabrication wherein the isolation structures 204 have been formed in the substrate 202. The isolation structures 204 may be formed using techniques and methods commonly employed in the semiconductor manufacturing industry. A schematically depicted ion implantation process 209 is performed to effectively damage the lattice structure of the substrate 200, thereby making it easier for refractory metal material to migrate so as to form the bottom electrode 208, as described more fully below. The dopant material employed in the ion implantation process 209 may vary depending on the particular application. In one example, the dopant material may be arsenic, and it may be implemented at a dopant dose of $1e^{15}$-$1e^{17}$ ions/cm$^2$ and at an energy level of approximately 100-500 keV. Of course, other dopant materials, such as germanium, silicon, etc., may be implanted instead of arsenic. The depth of maximum concentration of the implanted ions may be approximately 50-200 nm. In this particular example, the ion implantation process 209 is performed prior to the formation of the insulating layer(s) 210, the top electrode 206 and the spacers 212. Of course, if desired, the ion implantation process 209 could be performed after the aforementioned structures are formed.

Figure 3B:
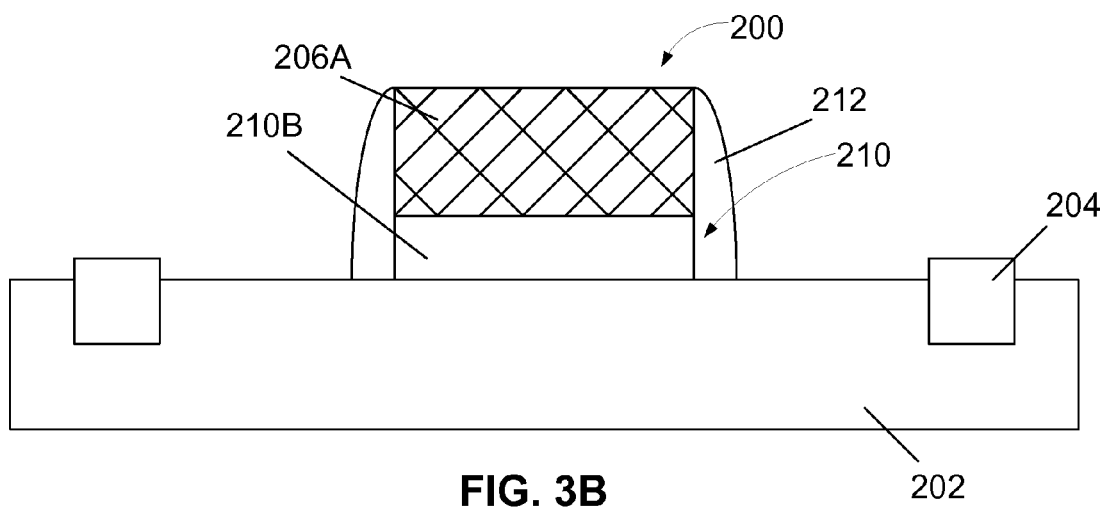

Next, as shown in FIG. 3B, the insulation layer 210B, the top electrode 206A and the spacers 212 are formed. As noted previously, the interfacial layer 210A may not be required in all applications, and it is omitted in FIGS. 3B-3C. The top electrode 206A is made from a material that, in this illustrative embodiment, can be converted to a metal silicide to form the final top electrode 206 depicted in FIGS. 2A-2B. For example, the top electrode 206A may be made of polysilicon.

Figure 3C:
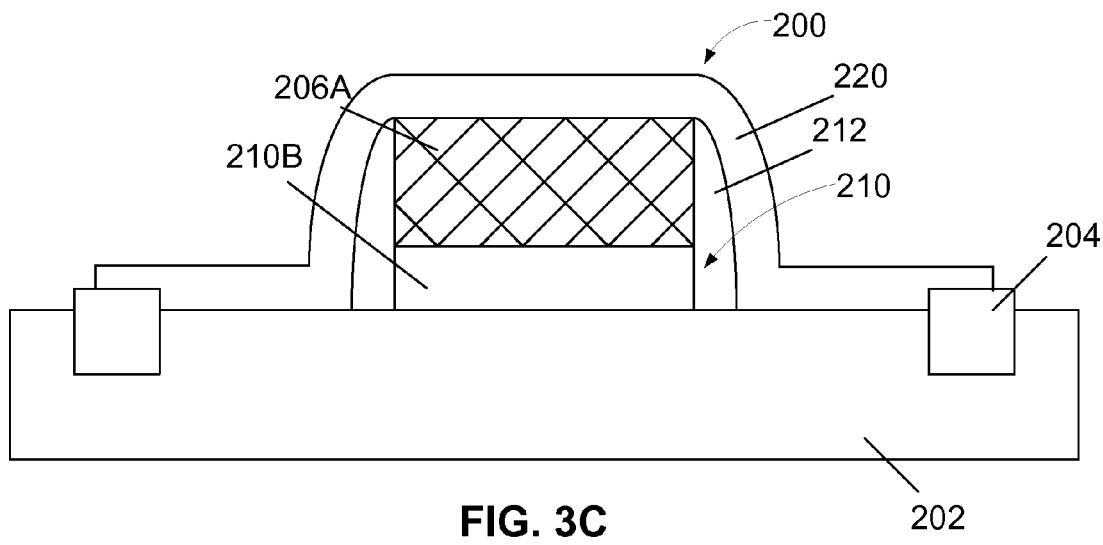

Next, as shown in FIG. 3C, a layer of refractory metal 220 is formed above the RRAM device 200. The composition, thickness and method of manufacture of the layer of refractory metal 220 may vary depending upon the application. In one illustrative embodiment, the refractory metal layer 220 may be nickel and it may be formed using an LPCVD (low pressure chemical vapor deposition) process. Ultimately, a heat treatment will be performed to form the metal silicide regions that constitute the top electrode 206 and the bottom electrode 208 or bottom electrodes 208A, 208B, depending upon the desired final configuration of the RRAM device 200. In one illustrative example, the heat treatment process may be a rapid thermal anneal process performed at a temperature of approximately 450° C. for a duration of approximately 30-90 seconds. As it relates to the formation of the metal silicide material, there is a relationship between the thickness of the refractory metal layer, the amount of silicon consumed and the thickness of the resulting metal silicide material. More specifically, in one illustrative example, 1.8 Å of nickel consumes approximately 1.0 Å of silicon to produce approximately 2.2 Å of nickel silicide.

The thickness of the layer of refractory metal 220 and/or the parameters of the heat treatment process, e.g., temperature and/or duration, may be varied to achieve either the single-bit construction (a single bottom electrode 208) depicted in FIG. 2A or the dual-bit construction (two bottom electrodes 208A, 208B) depicted in FIG. 2B. The thickness of the layer of refractory metal 220 may depend upon the width of the top electrode 206 (the "width" corresponding to the gate length of a similarly configured transistor). In one illustrative embodiment, for example, for a top electrode width of approximately 100 nm, to achieve the single electrode 208 depicted in FIG. 2A, the layer of refractory metal 220 may have a thickness of approximately 50-10 nm, while to achieve the dual electrode structures 208A, 208B depicted in FIG. 2B, the thickness of the layer of refractory metal 220 may be approximately 20-30 nm. Additionally, the duration of the heat treatment process may also be varied to achieve the desired single-bit or dual-bit construction. For example, for a single-bit construction, as shown in FIG. 2A, the duration of the heat treatment may be approximately 70-90 seconds, while the duration of the heat treatment process for the dual-bit construction depicted in FIG. 2B may be approximately 40-60 seconds. In one embodiment, the temperature of the heat treatment process is the same, i.e., approximately 450° C., although the temperature may be varied as well in achieving the desired single-bit or dual-bit construction of the RRAM device 200.

Figure 4A:
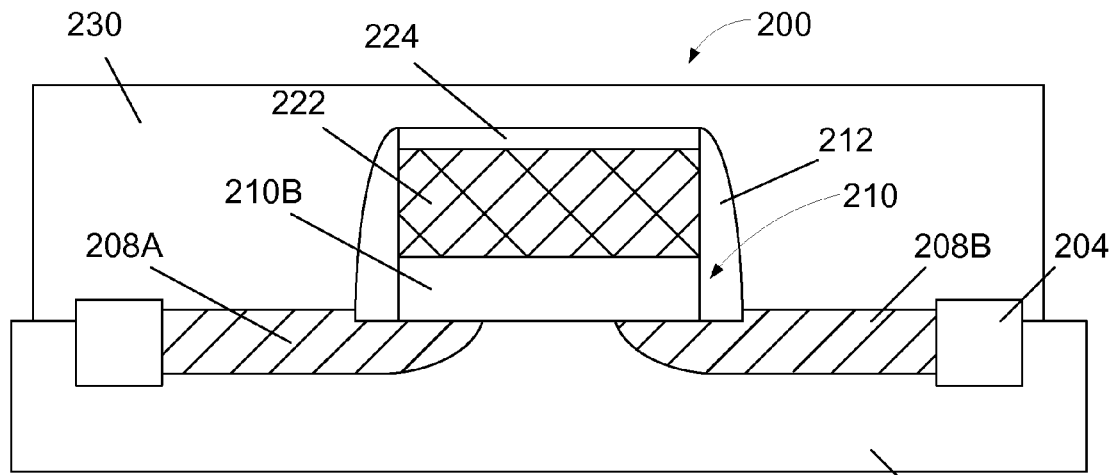
FIGS. 4A-4C depict one illustrative process for forming one illustrative embodiment of an RRAM device disclosed herein using a gate-last technique.
Figure 4B:
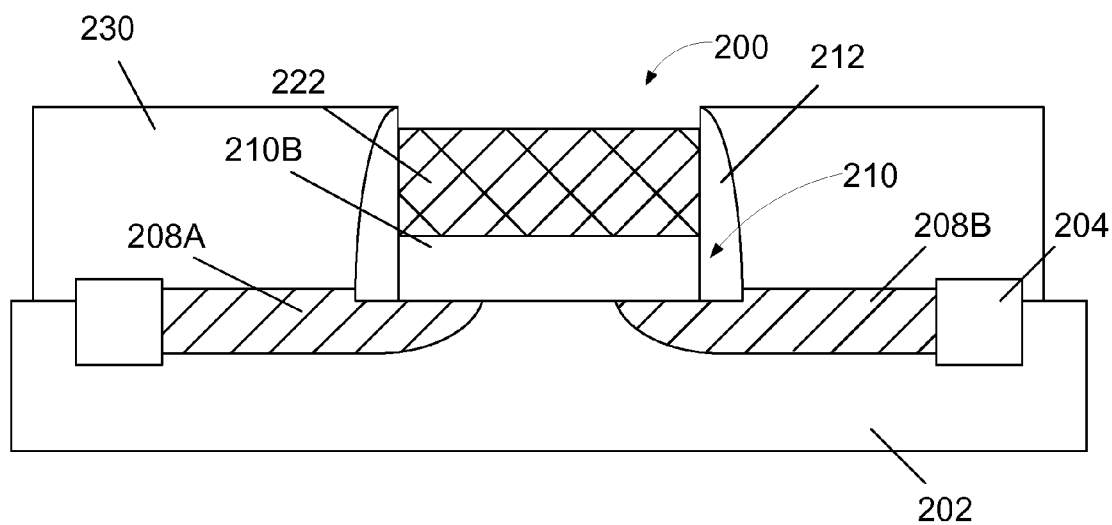
Figure 4C:
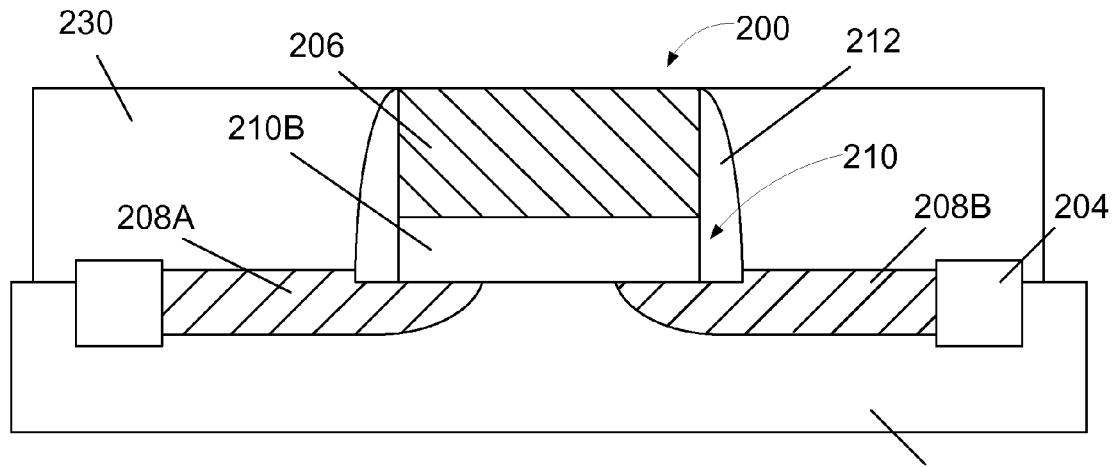

FIGS. 4A-4C depict an illustrative gate-last approach for formation of an illustrative dual-bit configured RRAM device 200 disclosed herein. As shown in FIG. 4A, the device is depicted at the point in fabrication wherein the bottom electrodes 208A, 208B, the insulation layer 210, a sacrificial top electrode 222, and sidewall spacers 212 have been formed. In this illustrative embodiment, a protective layer 224, e.g., an oxide layer, was formed over the sacrificial top electrode 222 during the fabrication process so that the refractory metal layer (not shown in FIG. 4A) would not contact the sacrificial top electrode 222. After the heat treatment process is performed to form the bottom electrodes 208A, 208B, and after an acid wash process is performed to remove any unreacted portions of the refractory metal layer (not shown in FIG. 4A), a layer of dielectric material 230 is formed above the RRAM device 200.

Thereafter, as shown in FIG. 4B, an illustrative chemical mechanical polishing (CMP) process is performed to expose the protective layer 224. Next, an etching process is performed to remove the protective layer 224 and thereby expose the sacrificial top electrode 222. Thereafter, the sacrificial top electrode 222 is removed by performing an etching process and the desired final top electrode 206 is formed, as shown in FIG. 4C. In one illustrative example, the top electrode 206 depicted in FIG. 4C is made from a metal-containing material such as titanium nitride. In one illustrative example, the RRAM device 200 depicted in FIG. 4C can be achieved by performing one or more etching processes to remove the sacrificial top electrode 222, and any underlying layers that are desired to be removed. Thereafter, if necessary, the insulating layer 210 may be formed in the cavity left when the sacrificial top electrode 222 is removed, and a deposition process may be performed to over-fill the cavity with the desired material for the final top electrode 206, e.g., titanium nitride. Thereafter, a CMP process may be performed to remove the excess material from above the insulating layer 230.

Figure 5A:
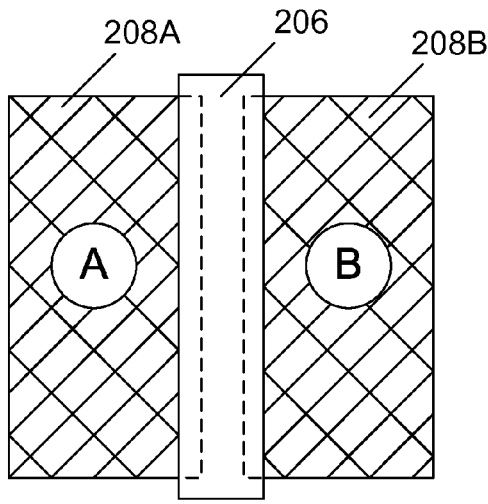
FIGS. 5A-5D depict illustrative configurations of various memory cells that may be created using the novel RRAM device disclosed herein.
Figure 5B:
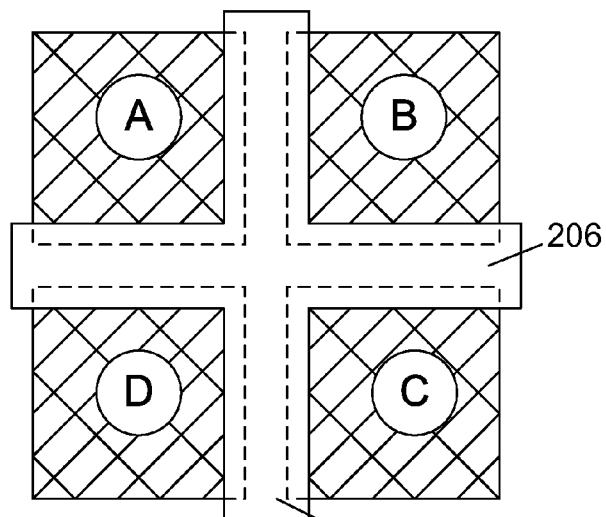
Figure 5C:
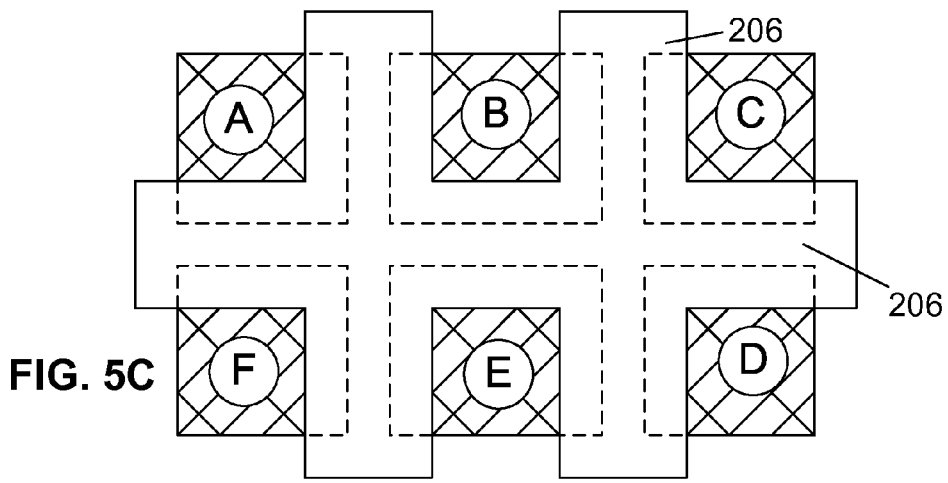
Figure 5D:
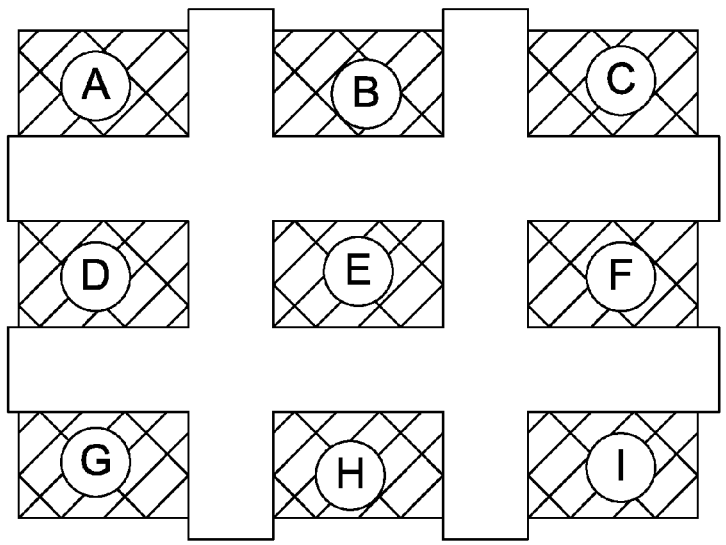

Various memory cell layouts are possible with the RRAM devices 200 disclosed herein. For example, using the illustrative dual-bit configuration RRAM device 200 depicted in FIG. 2B, a schematically depicted 2-bit cell may be formed, as depicted in FIG. 5A (bits A and B). Each of the bottom electrodes 208A, 208B may be connected to well-known read/write circuitry that enables each of the bottom electrodes 208A, 208B to be coupled to ground or to permit the bottom electrodes 208A, 208B to float. When a voltage is applied to the top electrode 206, current will only flow to a bottom electrode 208 that is grounded. Thus, by selectively coupling the desired one of the bottom electrodes 208A, 208B to ground, each individual bit may be accessed with well-known read/write circuitry. FIG. 5B depicts an illustrative layout for an illustrative 4-bit cell (bits A, B, C and D). In FIG. 5B, the top electrodes 206 are coupled together so only a single contact (not shown) need be established to the combined top electrode structure. To access the desired bit, the read/write circuitry is used to couple the desired bit, e.g., bit "C," to ground. FIGS. 5C-5D depict illustrative layouts for an illustrative 6-bit cell (with cells A-F) and an illustrative 9-bit cell (with cells A-I) configuration.

Figure 6A:
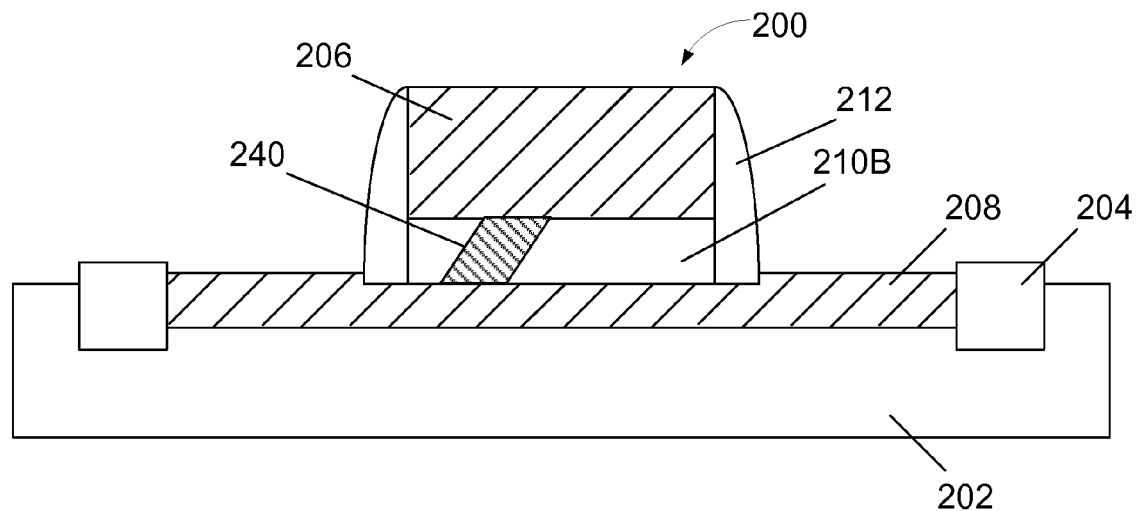
FIGS. 6A-6D are illustrative drawings and charts depicting the operational characteristics of one of the illustrative RRAM devices disclosed herein.
Figure 6B:
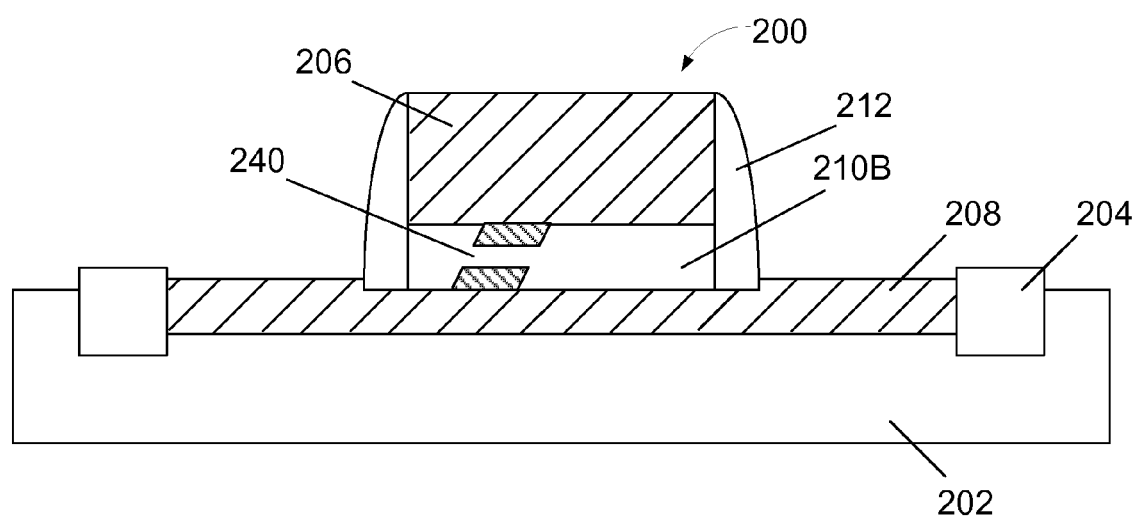
Figure 6C:
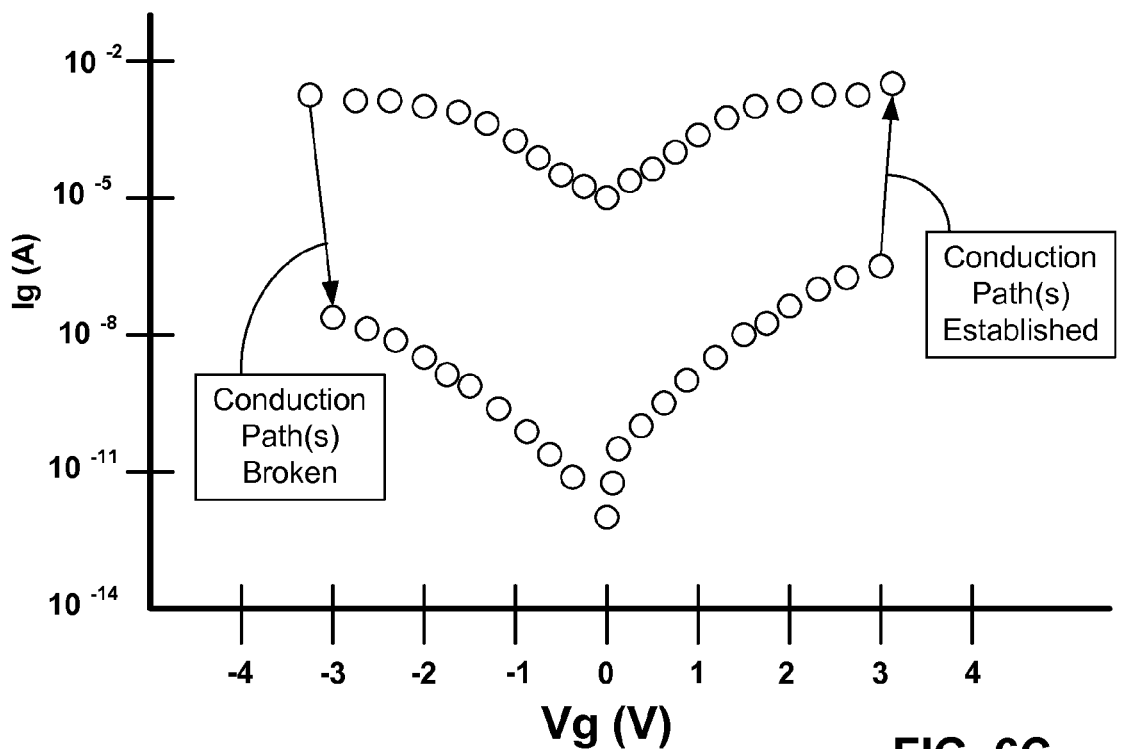
Figure 6D:
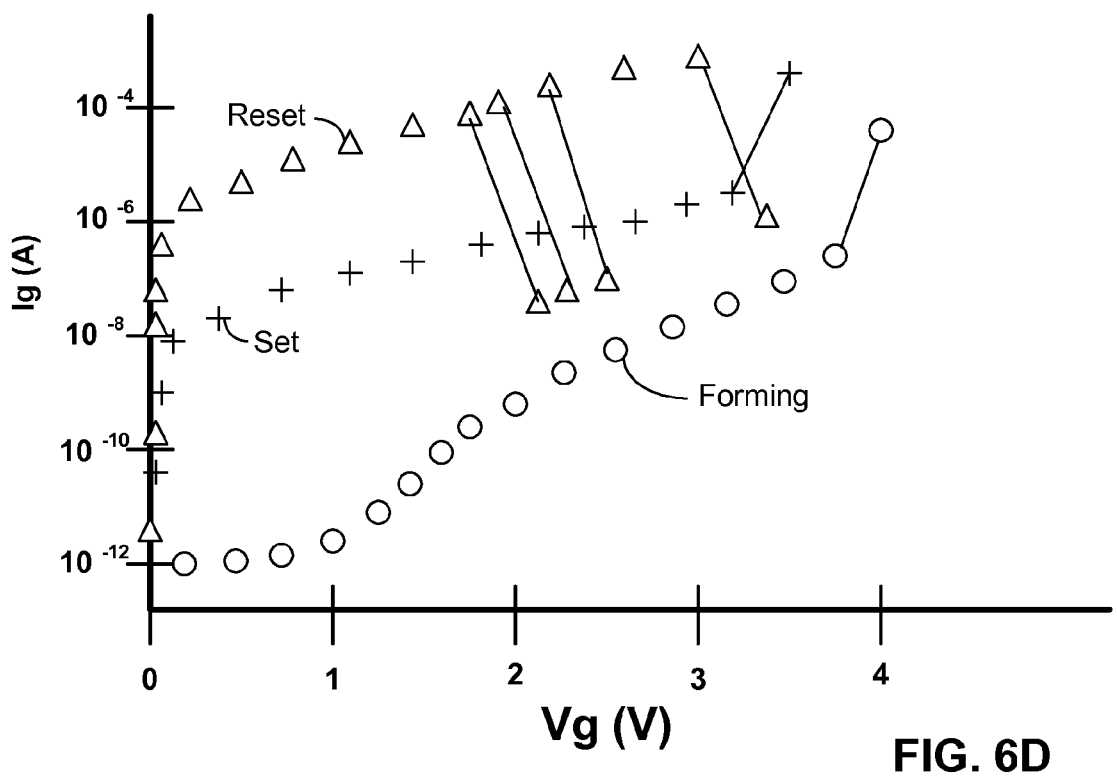

The operation of the RRAM devices 200 disclosed herein will now be discussed with reference to FIGS. 6A-6D. To facilitate discussion, an enlarged and simplified version of the single-bit configuration of the RRAM device 200 in FIG. 2A will be employed in FIGS. 6A-6B. FIGS. 6C-6D depict electrical characteristics of the illustrative RRAM devices 200 disclosed herein.

In general, a voltage ($V_g$) is applied to the top electrode 206 of the RRAM devices 200 disclosed herein to establish or create one or more schematically depicted conductive paths 240 between the top electrode 206 and the bottom electrode 208, which is grounded. More specifically, in one example, by applying a positive voltage ($V_g$) of approximately 3 volts to the top electrode 206, the insulation layer 210 breaks down, and one or more of the conductive paths 240 are created. The conductive paths 240 can be switched off or closed by applying a reverse voltage of the opposite polarity, e.g., −3 volts, to the top electrode 206.

The exact number, size and location of the conductive paths 240 created during this process are unknown, and they may vary depending upon the particular materials used and the voltages applied to the top electrode 206. Moreover, such characteristics of the conductive paths 240 may vary depending upon the particular application. The exact mechanism by which the conductive paths 240 are established and broken is still a matter of investigation. See, e.g., W. H. Liu et al., "Observation of Switching Behaviors in Post-Breakdown Conduction in NiSi-gated Stacks," June 2009, and N. Raghavan et al., "Unipolar Recovery of Dielectric Breakdown in Fully Silicided High-K Gate Stack Devices and its Reliability Implications," published online Apr. 5, 2010, both of which are hereby incorporated by reference in their entirety. One possible mechanism that explains the formation of the conductive paths 240 is the movement of negatively charged oxygen ions from the insulation layer 210 to the top electrode 206 when a positive voltage is applied to the top electrode 206. These negatively charged oxygen ions are stored in the top electrode 206 during this process. When a negative voltage is applied to the top electrode 206, the negatively charged oxygen ions are effectively repelled from the top electrode 206 and driven back toward the insulating layer 210, thereby breaking the conductive path 240. Another possible mechanism for establishment of the conductive path(s) 240 is that one or more metal filaments are formed that conductively connect to the top electrode 206 and the bottom electrode 208.

FIG. 6C is a graph depicting the electrical characteristics of a single-bit embodiment of the RRAM device disclosed herein. The application of the positive and negative voltages ($V_g$) to the top electrode 206 may generally be referred to as bipolar switching. As can be seen in FIG. 6C, when the applied voltage ($V_g$) to the top electrode 206 is increased to about +3 volts, one or more of the conductive paths 240 is established, and the current ($I_g$) between the top electrode 206 and the bottom electrode 208 suddenly increases by least one or two orders of magnitude. When a negative voltage of about −3 volts is applied to the top electrode 206, the conductive path(s) 240 are broken, or at least they are not longer conductive to the same magnitude as before, and the current ($I_g$) drops by one or two orders of magnitude. The change in the magnitude of the current ($I_g$) when the conductive paths 240 are established as compared to when the conductive paths 240 are closed or not as conductive as before can be measured and used to represent logical highs (a "1") and logical lows (a "0") in the RRAM device 200.

FIG. 6D is another simplified chart depicting the electrical characteristics of a "single-bit" configured RRAM device 200, wherein a unipolar switch technique may be employed with the RRAM device 200 disclosed herein. In this example, electrical data for three different stages is depicted: formation ("o"), set ("+") and reset ("Δ"). The "formation" data represents the initial formation of the conductive path(s) 240 wherein the device goes from an effectively non-conducting state at gate voltages less than 0.05 volts to a conductive state at gate voltages between 2-3 volts. The "reset" data reflects the situation where joule heating from leakage currents causes the conductive path(s) 240 to rupture or at least become less conductive, as reflected by the change in the device from a highly conductive state to a lower conductive state (as reflected by the drop in the gate current). The "set" data reflects the situation where the conductive path(s) 240 of the device are re-established as the device goes from a low conductive state to a highly conductive state when the gate voltage approaches or exceeds approximately 3 volts.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A resistance random access memory device, comprising:
   a semiconducting substrate;
   a metal silicide top electrode positioned above said substrate;
   a single metal silicide bottom electrode formed at least partially in said substrate, wherein at least a portion of said single bottom electrode is positioned below an entire width of said top electrode; and at least one insulating layer positioned between said top electrode and said single bottom electrode, wherein the at least one layer of insulating material is adapted to breakdown when an operating voltage is applied to said top electrode so as to thereby allow formation of at least one conductive path that extends through said at least one layer of insulating material between said metal silicide top electrode and said single metal silicide bottom electrode.

2. The device of claim 1, wherein said top electrode and said single bottom electrode are made of the same metal silicide material.

3. The device of claim 1, wherein said top electrode and said single bottom electrode are made of different metal silicide materials.

4. The device of claim 1, wherein said single bottom electrode is bounded by an isolation structure positioned in said substrate that surrounds said device.

5. The device of claim 1, wherein said at least one layer of insulating material comprises:
- a first layer of insulating material positioned on said substrate, said first layer of insulating material being a silicon-rich $SiO_x$ material; and
- a second layer of insulating material positioned on said first layer of insulating material, said second layer of insulating material having a dielectric constant of 3.9 or greater, wherein said top electrode is positioned on said second layer of insulating material.

6. A resistance random access memory device, comprising:
a semiconducting substrate;
a metal silicide top electrode positioned above said substrate;
two separated metal silicide bottom electrodes formed at least partially in said substrate, wherein a portion of each of said two bottom electrodes is positioned below separate portions of said top electrode; and
at least one insulating layer positioned between said portions of said top electrode and said underlying portions of said two bottom electrodes, wherein the at least one layer of insulating material is adapted to breakdown when an operating voltage is applied to said top electrode so as to thereby allow formation of at least one conductive path that extends through said at least one layer of insulating material between said metal silicide top electrode and at least one of said two separated metal silicide bottom electrodes, said at least one layer of insulating material comprising:
- a first layer of insulating material positioned on said substrate, said first layer of insulating material being a silicon-rich $SiO_x$ material; and
- a second layer of insulating material positioned on said first layer of insulating material, said second layer of insulating material having a dielectric constant of 3.9 or greater, wherein said top electrode is positioned on said second layer of insulating material.

7. The device of claim 6, wherein said top electrode and said two separated bottom electrodes are made of the same metal silicide material.

8. The device of claim 6, wherein said top electrode and said two separated bottom electrodes are made of different metal silicide materials.

9. The device of claim 6, wherein said top electrode and each of said two separated bottom electrodes are made of nickel silicide.

10. The device of claim 6, wherein said two bottom electrodes are bounded by an isolation structure positioned in said substrate that surrounds said device.

11. The device of claim 6, wherein said at least one insulating layer is comprised of a single layer of a high-k dielectric material having a dielectric constant of 3.9 or greater.

12. An array of resistance random access memory device, comprising:
a semiconducting substrate;
at least four spaced apart metal silicide bottom electrodes formed at least partially in said substrate; and
a common metal silicide top electrode structure that vertically overlaps a vertically underlying portion of each of said at least four spaced apart metal silicide bottom electrodes;
at least one insulating layer positioned between said overlapping portions of said top electrode and said vertically underlying portions of said at least four spaced apart metal silicide bottom electrodes, wherein the at least one layer of insulating material is adapted to breakdown when an operating voltage is applied to said common top electrode so as to thereby allow formation of at least one conductive path that extends through said at least one layer of insulating material between said common metal silicide top electrode and one of said at least four spaced apart metal silicide bottom electrodes, said at least one layer of insulating material comprising:
- a first layer of insulating material positioned on said substrate, said first layer of insulating material being a silicon-rich $SiO_x$ material; and
- a second layer of insulating material positioned on said first layer of insulating material, said second layer of insulating material having a dielectric constant of 3.9 or greater, wherein said common top electrode is positioned on said second layer of insulating material.

13. The array of claim 12, wherein said memory array consists of four spaced apart metal silicide bottom electrodes and said memory array defines a 2×2 memory cell.

14. The array of claim 12, wherein said memory array consists of six spaced apart metal silicide bottom electrodes and said memory array defines 2×3 memory cell.

15. The array of claim 12, wherein said memory array consists of nine spaced apart metal silicide bottom electrodes and said memory array defines a 3×3 memory cell.

16. The array of claim 12, further comprising circuitry means for selectively grounding only one of said at least four spaced apart metal silicide bottom electrodes when said operating voltage is applied to said common top electrode.

17. The device of claim 12, wherein said common top electrode and said at least four spaced apart metal silicide bottom electrodes are made of the same metal silicide material.

18. The device of claim 12, wherein said common top electrode and said at least four spaced apart metal silicide bottom electrodes are made of different metal silicide materials.

19. The device of claim 12, wherein said common top electrode and each of said at least four spaced apart metal silicide bottom electrodes are made of nickel silicide.

20. The device of claim 12, wherein said at least one insulating layer is comprised of a single layer of a high-k dielectric material having a dielectric constant of 3.9 or greater.

* * * * *